US011382219B2

(12) United States Patent
Liu et al.

(10) Patent No.: US 11,382,219 B2
(45) Date of Patent: Jul. 5, 2022

(54) MULTI-SCREEN DISPLAY APPARATUS

(71) Applicant: CHAMP VISION DISPLAY INC., Miao-Li County (TW)

(72) Inventors: Chin-Ku Liu, Miao-Li County (TW); Fa-Chih Liu, Miao-Li County (TW); Jhong-Hao Wu, Miao-Li County (TW)

(73) Assignee: CHAMP VISION DISPLAY INC., Miao-Li County (TW)

( * ) Notice: Subject to any disclaimer, the term of this patent is extended or adjusted under 35 U.S.C. 154(b) by 663 days.

(21) Appl. No.: 16/429,076

(22) Filed: Jun. 3, 2019

(65) Prior Publication Data

US 2019/0380213 A1 Dec. 12, 2019

(30) Foreign Application Priority Data

Jun. 6, 2018 (CN) .......................... 201820867678.3

(51) Int. Cl.
*H05K 7/02* (2006.01)
*H05K 7/04* (2006.01)
*H05K 5/00* (2006.01)
*G02B 7/00* (2021.01)

(52) U.S. Cl.
CPC ............. *H05K 5/0017* (2013.01); *G02B 7/00* (2013.01); *H05K 5/0021* (2013.01)

(58) Field of Classification Search
CPC combination set(s) only.
See application file for complete search history.

(56) References Cited

U.S. PATENT DOCUMENTS

| 4,964,771 | A | * | 10/1990 | Callihan | B60R 7/02 410/96 |
|---|---|---|---|---|---|
| 8,330,900 | B2 | | 12/2012 | Kuo et al. | |
| 2011/0134150 | A1 | * | 6/2011 | Imamura | G06F 3/1446 345/87 |
| 2011/0164200 | A1 | * | 7/2011 | Watanabe | G02F 1/13336 349/58 |
| 2011/0279426 | A1 | * | 11/2011 | Imamura | G09G 3/30 345/207 |
| 2015/0116852 | A1 | * | 4/2015 | Kim | G02B 5/045 359/837 |
| 2017/0086308 | A1 | | 3/2017 | Large et al. | |

FOREIGN PATENT DOCUMENTS

| CN | 101416094 A | 4/2009 |
|---|---|---|
| CN | 202837794 U | 3/2013 |
| CN | 203644317 U | 6/2014 |
| CN | 104978901 A | 10/2015 |

(Continued)

*Primary Examiner* — Hung S. Bui (57) ABSTRACT

A multi-screen display apparatus includes two display screens, an optical element and an optical element fixing mechanism. The two display screens are arranged adjacent to each other, wherein the two display screens have an included angle. Each of the display screens has a display area and a frame surrounding the display area. The optical element is disposed between the two display screens and covers two adjacent sides of the frames of the two display screens and portions of the display areas of the two display screens. The optical element fixing mechanism includes a fixing cord, and the fixing cord is configured to fix the optical element to one of the two display screens.

15 Claims, 9 Drawing Sheets

(56) References Cited

FOREIGN PATENT DOCUMENTS

| | | |
|---|---|---|
| CN | 205485774 U | 8/2016 |
| CN | 106886253 A | 6/2017 |
| TW | 201024977 A1 | 7/2010 |
| TW | I411848 B | 10/2013 |
| TW | 201610960 A | 3/2016 |
| TW | 201706976 A | 2/2017 |
| TW | I603305 B | 10/2017 |
| TW | 201805922 A | 2/2018 |
| TW | I642050 B | 11/2018 |

* cited by examiner

MULTI-SCREEN DISPLAY APPARATUS

CROSS-REFERENCE TO RELATED APPLICATION

This application claims the priority benefit of China application 201820867678.3, filed on 2018 Jun. 6. The entirety of the above-mentioned patent application is hereby incorporated by reference herein and made a part of this specification.

FIELD OF THE INVENTION

The invention relates to a display apparatus, and more particularly to a multi-screen display apparatus.

BACKGROUND OF THE INVENTION

People who have used a multi-screen display apparatus know the convenience of the multi-screen display apparatus. Because using multi screens can receive more information from the screens at the same time, and achieve rapid analysis and integration of multiplex effects, the multi-screen display apparatus has been widely used in specific industries, such as the stock securities industry. In general, using multi screens can also help increase work efficiency. In addition, the multi-screen simultaneous output allows a user to adjust the size of a desired viewing screen and enjoy different visual perceptions. Moreover, current high level graphics cards almost all support multi-screen output. After the user buys multiple screens, they can splice the desired display configuration manner and enjoy better viewing quality. In addition, in the market of audio-visual entertainment, multi-screen display is also one of the focuses that players expect to enjoy.

On the other hand, in the display industry, a curved screen is considered as one of the key development projects. The curved screen has a visual experience that is immersive. A design of a curved surface makes a viewer feel like being surrounded by a no dead angle, and the visual effect is more vivid when a depth of field becomes deeper or a viewing distance becomes closer.

However, whether it is a flat screen or a curved screen, it includes a frame around a display area. When using a plurality of screens to splice, the frame at the splicing place will affect the viewing quality.

The information disclosed in this "BACKGROUND OF THE INVENTION" section is only for enhancement understanding of the background of the invention and therefore it may contain information that does not form the prior art that is already conventional to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a multi-screen display apparatus, which reduces the problem that the frames of the screens affect the display quality.

Other advantages and objects of the invention may be further illustrated by the technical features broadly embodied and described as follows.

In order to achieve one or a portion of or all of the objects or other objects, a multi-screen display apparatus provided in an embodiment of the invention includes two display screens, an optical element and an optical element fixing mechanism. The two display screens are arranged adjacent to each other, wherein the two display screens have an included angle. Each of the two display screens has a display area and a frame surrounding the display area. The optical element is disposed between the two display screens and covers two adjacent sides of the frames of the two display screens and portions of the display areas of the two display screens. The optical element fixing mechanism includes a fixing cord, and the fixing cord is configured to fix the optical element to one of the two display screens.

The optical element fixing mechanism of the embodiment of the invention includes a fixing cord, and the optical element can be fixed on the display screen by the fixing cord, so that the optical element can be disposed between the two display screens according to design requirements, and the optical element fixing mechanism can be applied to different types of display screens. The optical element fixed to the display screen can guide a light beam emitted from a portion of the display area covered by the optical element to a viewer's eyes, so that when the viewer views the image formed by splicing a plurality of display screens, the frames and the optical element between the adjacent two display screens are not easily perceived, thus the display quality can be improved.

Other objectives, features and advantages of The invention will be further understood from the further technological features disclosed by the embodiments of The invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
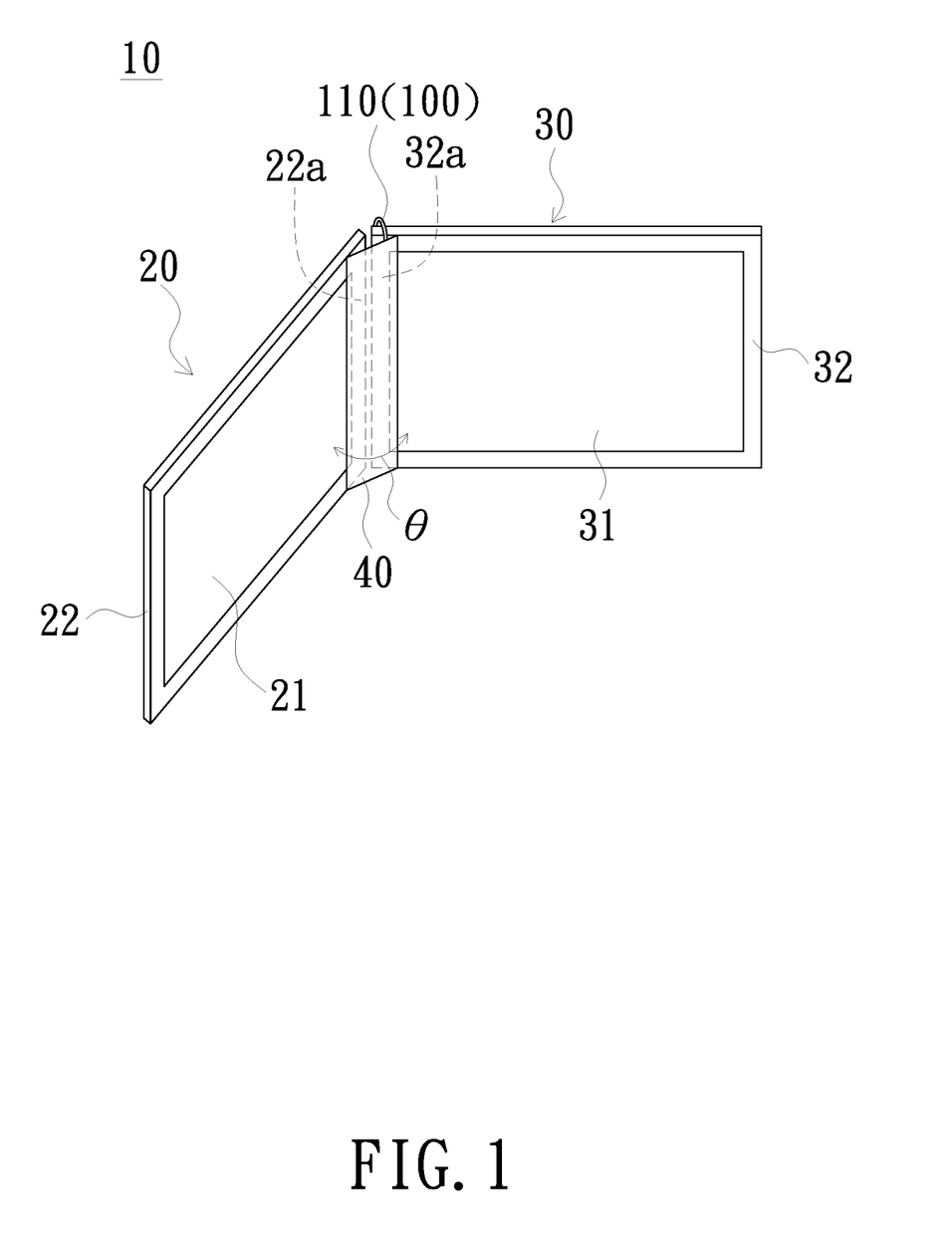
FIG. 1 is a schematic diagram of a multi-screen display apparatus of one embodiment of the invention.
Figure 2A:
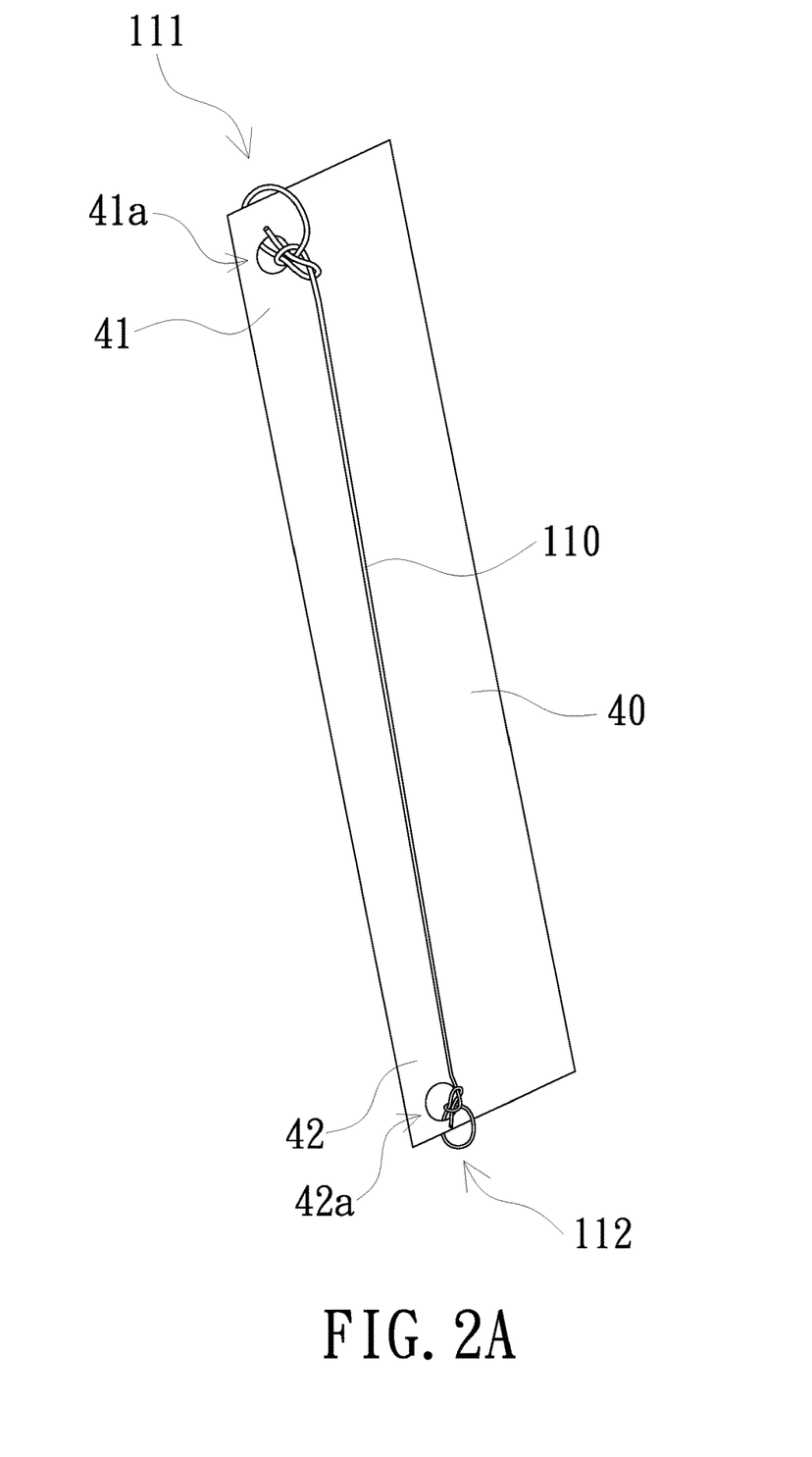
FIG. 2A is a schematic diagram of an optical element fixing mechanism and an optical element of one embodiment of the invention.
Figure 2B:
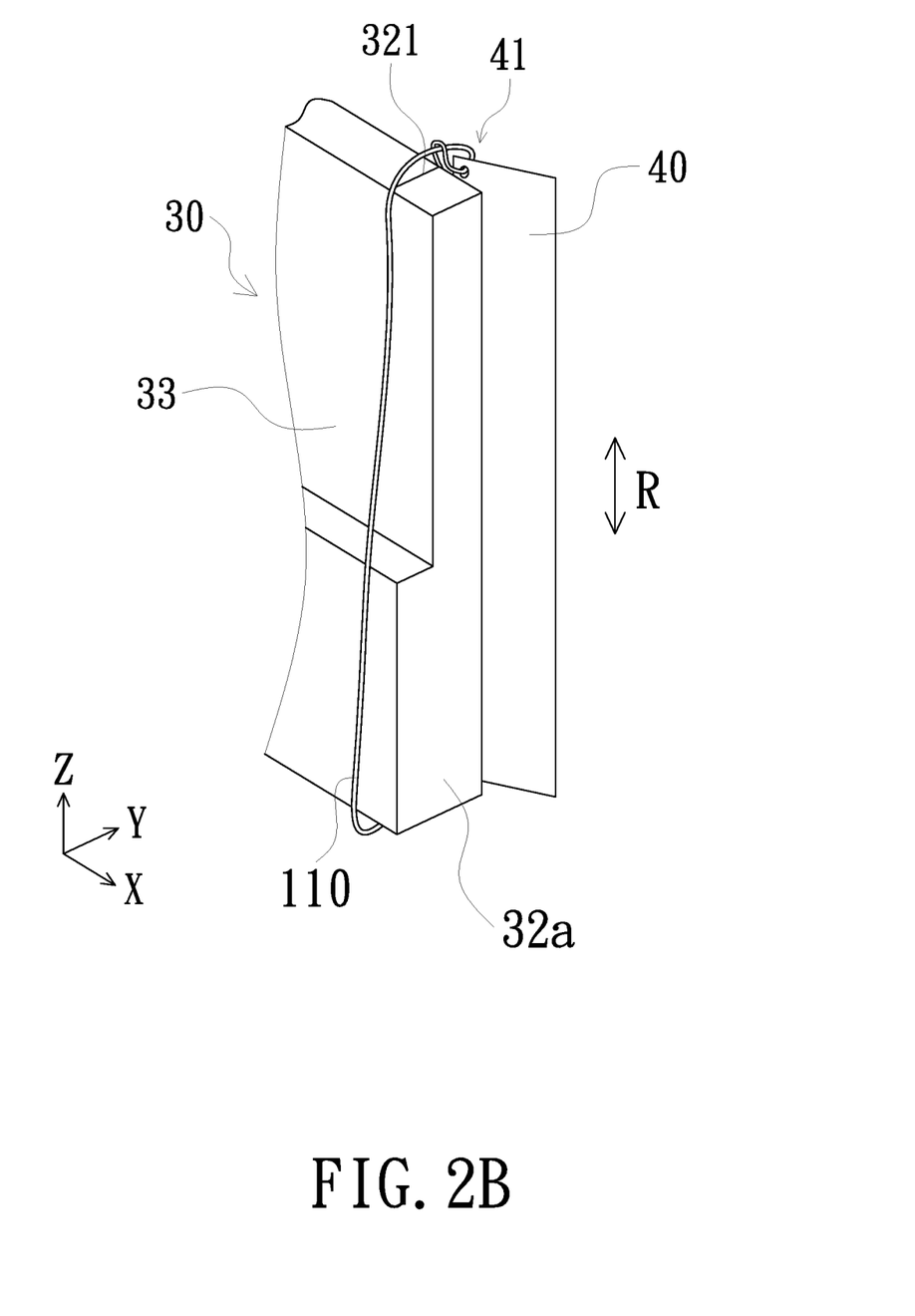
FIG. 2B is a schematic diagram of an optical element fixing mechanism fixed to a display screen in accordance with one embodiment of the invention.

FIG. 1 is a schematic diagram of a multi-screen display apparatus of one embodiment of the invention. FIG. 2A is a schematic diagram of an optical element fixing mechanism and an optical element of one embodiment of the invention. FIG. 2B is a schematic diagram of an optical element fixing mechanism fixed to a display screen in accordance with one embodiment of the invention. Referring to FIG. 1, FIG. 2A and FIG. 2B, a multi-screen display apparatus 10 of the embodiment includes two display screens 20, 30, an optical element 40 and an optical element fixing mechanism 100. The two display screens 20, 30 are arranged adjacent to each other, wherein the two display screens 20, 30 have an included angle θ. The display screen 20 has a display area 21 and a frame 22 surrounding the display area 21, and the display screen 30 has a display area 31 and a frame 32 surrounding the display area 31. The optical element 40 is disposed between the two display screens 20, 30 and covers two adjacent sides 22a, 32a of the frames 22, 32 of the two display screens 20, 30 and portions of the display areas 21, 31 of the two display screens 20, 30. The optical element fixing mechanism 100 includes a fixing cord 110, and the fixing cord 110 is configured to fix the optical element 40 to one of the two display screens 20, 30. The multi-screen display apparatus described below is exemplified by two display screens 20, 30 and one optical element 40, but is not limited thereto. There may also be a plurality of display screens, and whether the optical element is disposed between every two display screens or not may be chosen according to design requirements, and the quantity of the optical element fixing mechanism corresponds to the quantity of the optical element. In addition, in the following embodiments of the invention, for convenience of description, the optical element 40 is fixed to the display screen 30 by the fixing cord 110, but the fixing cord 110 may also fix the optical element 40 to the display screen 20. In other embodiments, the optical element 40 may also be respectively fixed to the two display screens 20, 30 by more than one fixing cord 110.

The optical element 40 has, for example, two fixing portions 41a, 42a which are respectively located at two ends 41, 42 in a fixing direction R parallel to the side 32a (parallel to a Z axis). Two ends 111, 112 of the fixing cord 110 are respectively fixed to the two fixing portions 41a, 42a, and the fixing cord 110 winds around a backside 33 of the display screen 30. The style of the two fixing portions 41a, 42a and the method of fixing the two ends 111, 112 of the fixing cord 110 to the two fixing portions 41a, 42a are not particularly limited. In one embodiment, a distance between the two fixing portions 41a, 42a is smaller than a length of each of the two sides 22a, 32a. The fixing portions 41a, 42a in FIG. 2A are, for example, openings, and the two ends 111, 112 of the fixing cord 110 are respectively disposed to pass through and are fixed to the two fixing portions 41a, 42a. In another embodiment, the two ends 111, 112 of the fixing cord 110 can be bonded to the two fixing portions 41a, 42a by an adhesive.

The fixing cord 110 includes, for example, an elastic fixing cord, and a length of the elastic fixing cord when not stretched is smaller than a length of each of the two sides 22a, 32a, so that the fixing cord 110 is in a stretched state when fixing the optical element 40 to the display screen 30, and the elastic force generated by the stretching can make the optical element 40 relatively firmly fixed to the display screen 30.

The two display screens 20, 30 may be various types of display screens, such as liquid crystal display screens, organic light emitting diode display screens, etc., but are not limited thereto. The display screens 20, 30 may be flat display screens or curved display screens.

Figure 3:
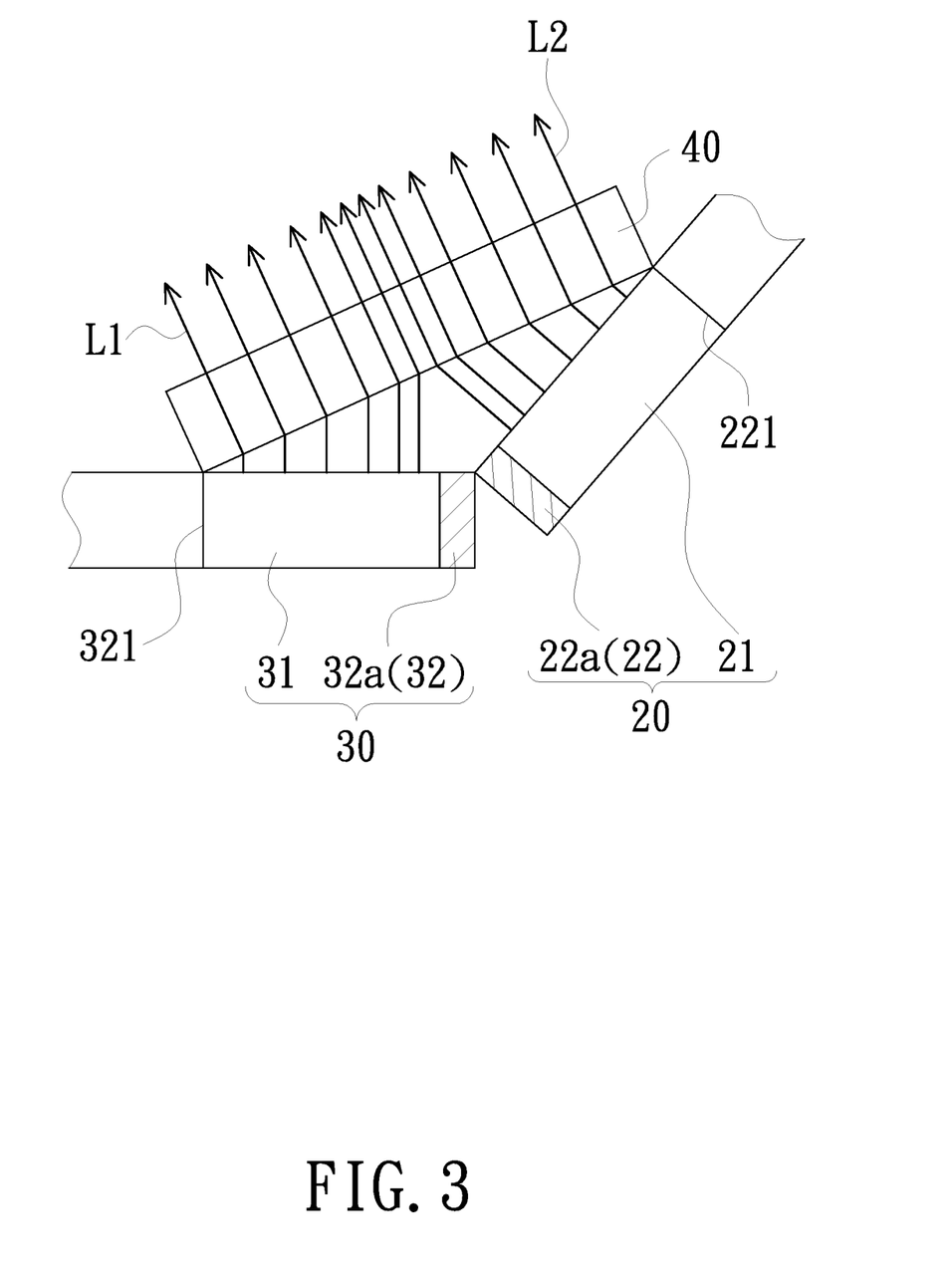
FIG. 3 is a schematic diagram showing an optical path of forward light of two adjacent display screens passing through an optical element in accordance with one embodiment of the invention.

FIG. 3 is a schematic diagram showing an optical path of forward light of two adjacent display screens passing through an optical element in accordance with one embodiment of the invention. Referring to FIG. 3, the optical element 40 covers two adjacent sides 22a, 32a of the frames 22, 32 of the two display screens 20, 30 and portions of the display areas 21, 31 of the two display screens 20, 30, so that the optical element 40 refracts the light beams L1, L2 that are emitted forward from the portions of the display areas 21, 31, and the light beams L1, L2 pass through the optical element 40 and are emerged forward by the optical element 40 to a viewer. Through the refraction of the optical element 40, the regions corresponding to the adjacent sides 22a, 32a of the frames 22, 32 of the adjacent two display screens 20, 30 also have light beams L1, L2 transmitted toward the viewer, so that the viewer will not view the adjacent sides 22a, 32a of the frames 22, 32 of the adjacent two display screens 20, 30. Therefore, when the two adjacent display screens 20 and 30 jointly display one image, the viewer can view a good splicing image without affecting the display quality due to the frames 22 and 32.

The optical element fixing mechanism 100 of the embodiment includes a fixing cord 110, and the optical element 40 can be fixed on one of the two display screens 20, 30 by the fixing cord 110, so that the optical element 40 can be disposed between the two display screens 20, 30 according to design requirements, and the optical element fixing mechanism 100 can be applied to different types of display screens 20, 30. The optical element 40 fixed to the display screen 30 can guide the light beams L1, L2 emitted from portions of the display areas 21, 31 covered by the optical element 40 to a viewer's eyes, so that when the viewer views the image formed by splicing the display screens 20, 30, the sides 22a, 32a and the optical element 40 between the adjacent two display screens 20, 30 are not easily perceived, and thus the display quality can be improved.

The frame 22 of the display screen 20 may further have, for example, a positioning line 221. The frame 32 of the display screen 30 may further have, for example, a positioning line 321. When the fixing cord 110 fixes the optical element 40 to one of the two display screens 20, 30, the optical element 40 is adjusted to an appropriate position by aligning the positioning lines 221, 321. In other embodiments, the positioning line 221 is presented on the display area of the display screen.

Figure 4:
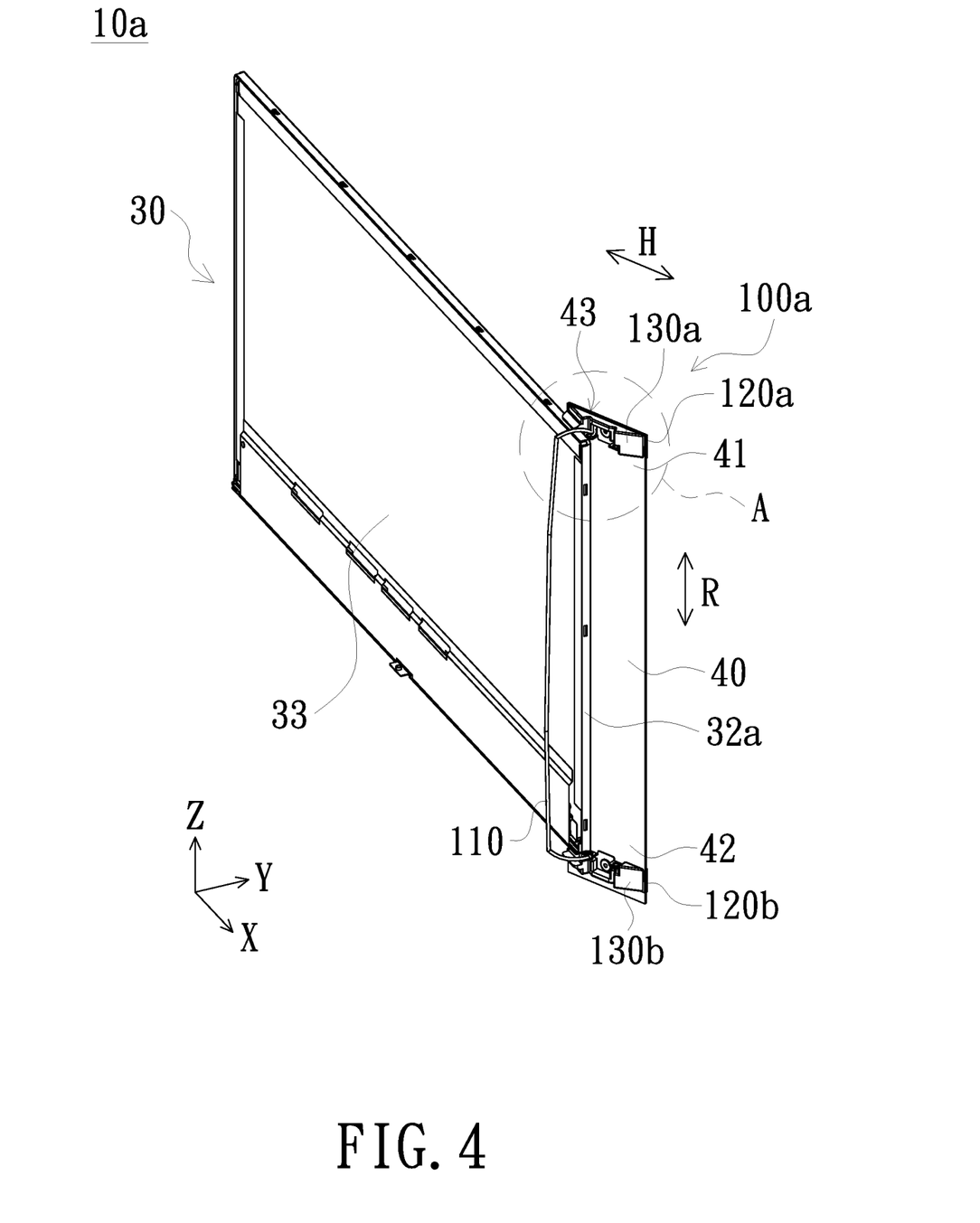
FIG. 4 is a schematic perspective view showing that an optical element fixing mechanism fixes an optical element in accordance with another embodiment of the invention.
Figure 5:
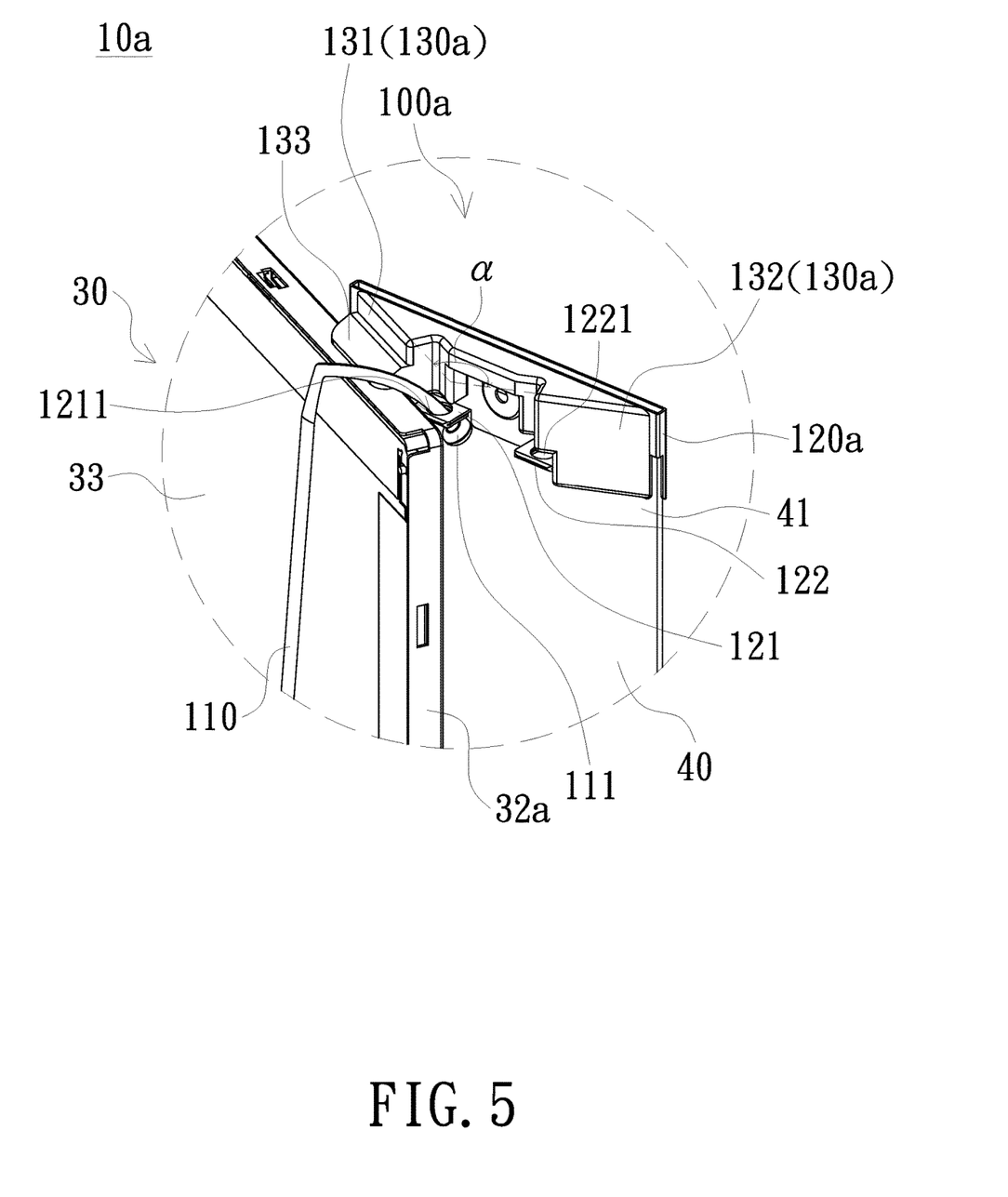
FIG. 5 is an enlarged schematic view of area A of FIG. 4.

FIG. 4 is a schematic perspective view showing that an optical element fixing mechanism fixes an optical element in accordance with another embodiment of the invention. FIG. 5 is an enlarged schematic view of area A of FIG. 4. Referring to FIG. 4 and FIG. 5, in the multi-screen display apparatus 10a of the embodiment, the optical element fixing mechanism 100a further includes, for example, two rings 120a, 120b, The two rings 120a, 120b are respectively sleeved on the two ends 41, 42 of the optical element 40 in a fixing direction R parallel to the side 32a. Since the rings 120a, 120b have the same structure, the following description will be made with the ring 120a shown in FIG. 5. The ring 120a has protrusions 121, 122 that protrude toward the display screen 30. The protrusion 121 has a through hole 1211. The protrusion 122 has a through hole 1221. The two ends 111, 112 (not shown) of the fixing cord 110 are respectively fixed to the through holes 1211 of the two rings 120a, 120b, and the fixing cord 110 winds around a backside 33 of the display screen 30.

The quantity of the protrusion of the ring 120a is, for example, two, but is not limited thereto. The protrusion 122 corresponds to the display screen 20 of FIG. 1, and the protrusion 121 corresponds to the display screen 30. When the fixing cord 110 fixes the optical element 40 to one of the two display screens 20, 30, the two ends 111, 112 of the fixing cord 110 may be respectively fixed to the through holes 1211, 1221 of the corresponding protrusions 121, 122 of the two rings 120a, 120b according to the selected display screens 20, 30 to fix. In addition, in the embodiment, the two ends 111, 112 of the fixing cord 110 are respectively disposed to pass through and are fixed to the through holes 1211 of each of the two rings 120a, 120b, but are not limited thereto. In another embodiment, the two ends 111, 112 of the fixing cord 110 are, for example, respectively provided with a fastening member, and are fastened to the through holes 1211 of the two rings 120a, 120b by the fastening members.

The optical element fixing mechanism 100a further includes, for example, two positioning members 130a, 130b disposed on a side of the optical element 40 facing the display screens 20, 30 and at two ends 41, 42 in a fixing direction R of the optical member 40. In the embodiment, the two positioning members 130a, 130b are, for example, fixed to the two rings 120a, 120b. Since the positioning members 130a, 130b have the same structure, the following description will be made with the positioning member 130a shown in FIG. 5. The positioning member 130a has two abutting portions 131, 132. The two abutting portions 131, 132 are, for example, planes, but are not limited thereto. An intersection of the two planes forms an included angle α, and the included angle α is equal to the included angle θ. Taking FIG. 5 as an example, the display screen 30 abuts against the abutting portion 131, and the display screen 20 shown in FIG. 1 abuts against the abutting portion 132.

Specifically, when the fixing cord 110 fixes the optical element 40 to the display screen 30, the display screen 30 abuts against the abutting portion 131 of the two positioning members 130a, 130b, and then the display screen 20 is configured to abut against the abutting portion 132. Since the included angle α is the same as the included angle θ, the two positioning members 130a, 130b may achieve the effect of positioning the two display screens 20, 30, and may be replaced with two positioning members 130a, 130b having different included angles α depending on design requirements. In addition, the two positioning members 130a, 130b may also be configured as structural reinforcement members, i.e. by making the material hardness of the two positioning members 130a, 130b larger than the hardness of the optical element 40, the ability of the optical element 40 to resist bending deformation in a horizontal direction H parallel to a short side 43 of the optical element 40 and in the fixing direction R parallel to long sides of the optical element 40 can be increased.

Each of the two positioning members 130a, 130b has, for example, a clamping portion 133. The clamping portion 133 is connected to one of the two abutting portions 131, 132, and is connected to the abutting portion 131 as an example in FIG. 5. The clamping portion 133 of the positioning member 130a and the clamping portion 133 of the positioning member 130b jointly clamp the display screen 30 fixed by the fixing cord 110.

In the embodiment, each of the two positioning members 130a, 130b has abutting portions 131, 132 and a clamping portion 133, and the two positioning members 130a, 130b may further be configured as structural reinforcement members, that is, the two positioning members 130a, 130b are multi-functional structures, but are not limited thereto. In another embodiment, the above functions may be derived from different elements, such as a positioning member, a clamping member, a structural reinforcement member, and the like.

Figure 6:
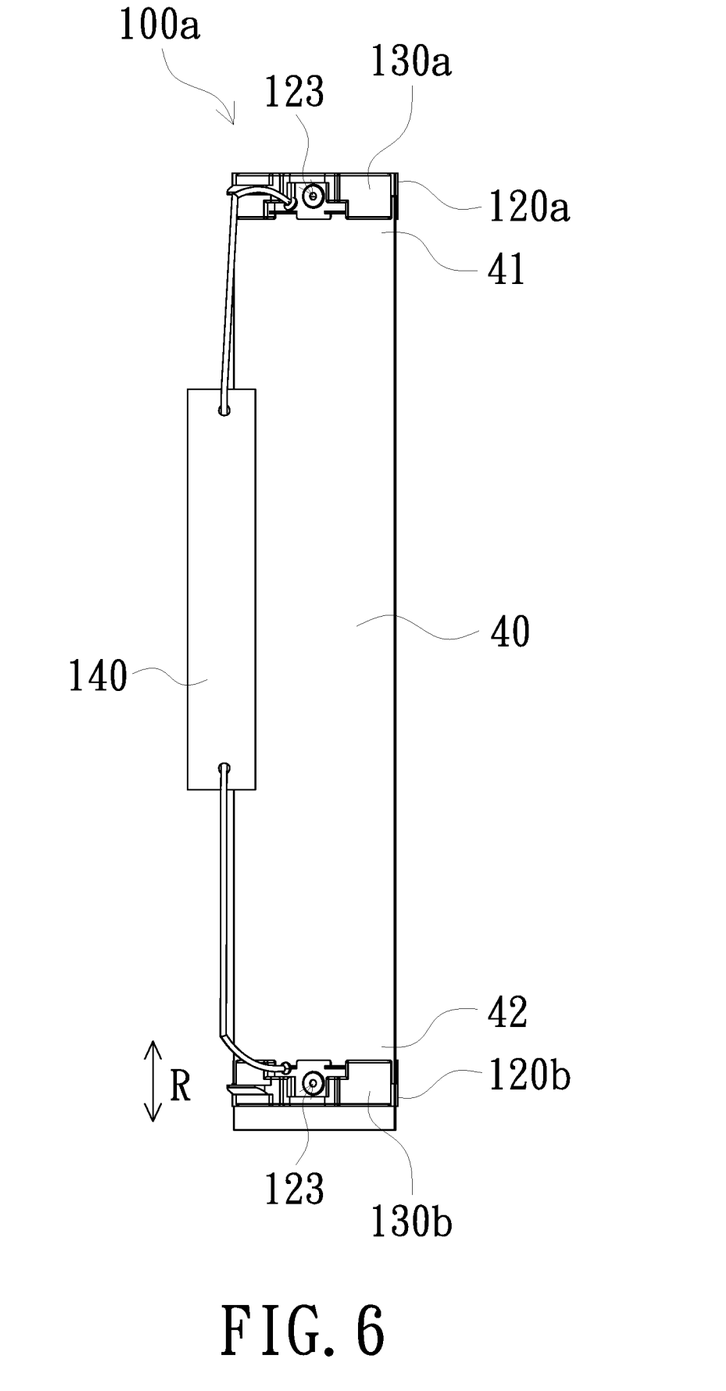
FIG. 6 is a schematic diagram of an optical element fixing mechanism and an optical element of another embodiment of the invention.

The optical element fixing mechanism 100a further includes, for example, an adhesive (not shown). When the two rings 120a, 120b are sleeved on the two ends 41, 42 of the optical element 40, the adhesive can be bonded between the two rings 120a, 120b and the optical element 40 to achieve a function of fixation. Alternatively, at least one of the two rings 120a, 120b may also be a movable ring. FIG. 6 is a schematic diagram of an optical element fixing mechanism and an optical element of another embodiment of the invention. Referring to FIG. 6, in the embodiment, the ring 120a is a fixed ring, and the ring 120b is a movable ring, but is not limited thereto. The ring 120a is fixed to one end 41 of the optical element 40 by, for example, the adhesive, and the ring 120b is sleeved on the other end 42 of the optical element 40 and configured to move up and down along the fixing direction R. The optical element fixing mechanism 100a further includes, for example, a locking screw (not shown), and the ring 120b further has, for example, a screw hole 123. The locking screw is screwed into the screw hole 123 and abuts against the optical element 40, so that the ring 120b can be fixed to the optical element 40 after being moved to an appropriate position. The ring 120a also has a screw hole 123, and the mobility of the ring 120a can be adjusted according to design requirements. The fixing manner of the movable ring is not particularly limited. For example, a clip may be used. When the movable ring is adjusted to an appropriate position, the movable ring is fixed to the optical element 40 by the clip.

The optical element fixing mechanism 100*a* further includes, for example, a label tape 140 (shown only in FIG. 6), and the fixing cord 110 is disposed to pass through the label tape 140, and the label tape 140 can be designed in different styles to achieve an aesthetic function.

Figure 7:
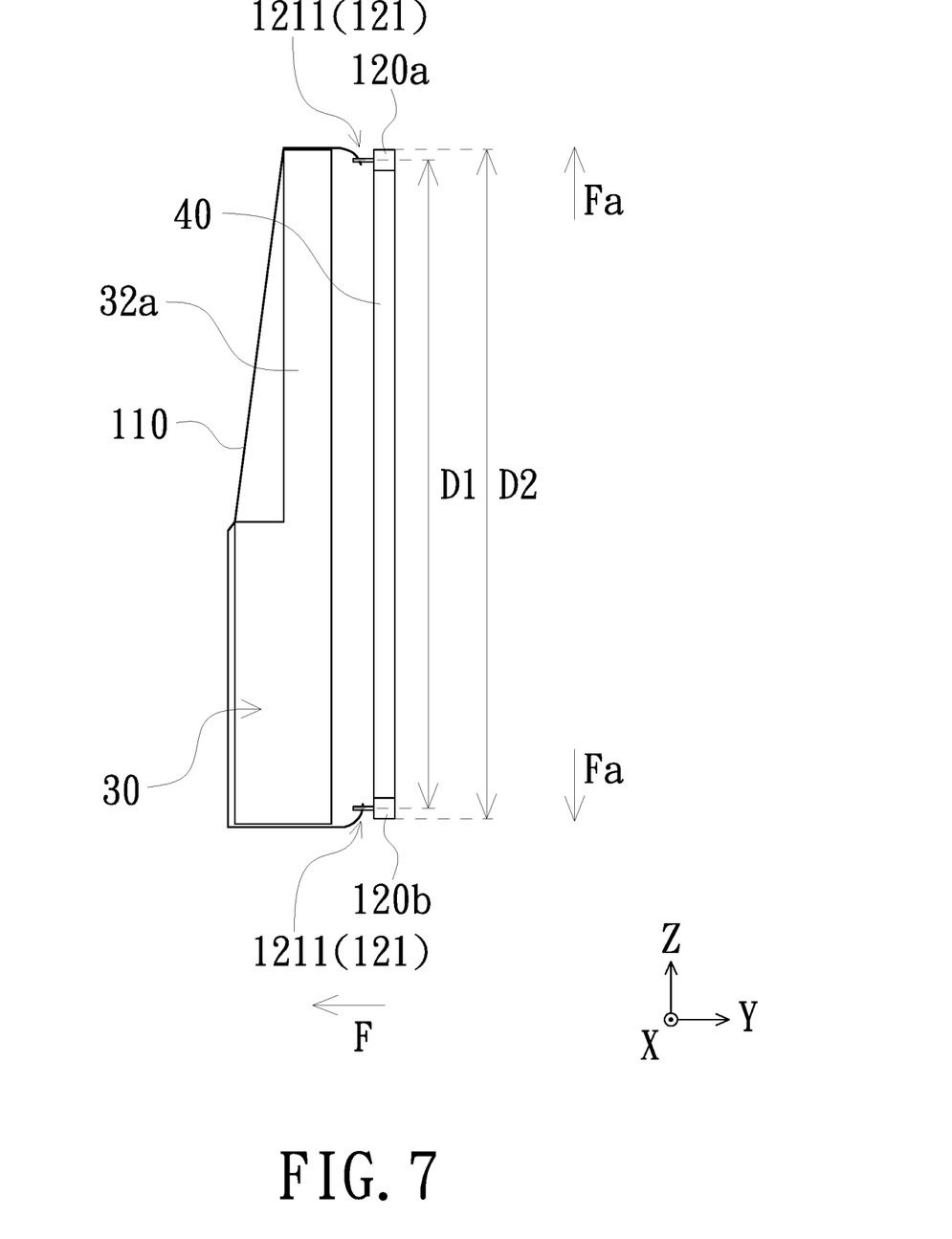
FIG. 7 is a schematic side view of FIG. 4 in a YZ plane.

FIG. 7 is a schematic side view of FIG. 4 in a YZ plane. Referring to FIG. 7, a distance D1 of the through hole 1211 of the ring 120*a* to the through hole 1211 of the ring 120*b* is, for example, smaller than a length D2 of the side 32*a*. In another embodiment, when the optical element 40 is fixed to the display screen 20, the distance D1 is, for example, smaller than a length of the side 22*a*. Specifically, in the case where the distance D1 is smaller than the distance D2, when the fixing cord 110 fixes the optical element 40, in addition to a pulling force F parallel to a Y-axis, a tension force Fa on a Z-axis is further generated. The tension force Fa may reduce the bending deformation of the optical element 40 due to the pulling force F.

The fixing mechanism of the optical element fixing mechanism 100*a* of the embodiment is that after the two rings 120*a*, 120*b* are sleeved on the two ends 41, 42 of the optical element 40, the two ends 111, 112 of the fixed cord 110 are respectively fixed to the through holes 1211 of the two rings 120*a*, 120*b*, and the fixing cord 110 winds around the backside 33 of the display screen 30. The movable ring 120*b* is adjusted to a position fitting the size of the display screen 30 and fixed, so that the clamping portion 133 of the positioning member 130*a* and the clamping portion 133 of the positioning member 130*b* jointly clamp the display screen 30 fixed by the fixing cord 110, and the abutting portions 131 of the two positioning members 130*a*, 130*b* abut against the display screen 30, thereby achieving the fixing function of the optical element fixing mechanism 100*a*. Next, the display screen 20 (shown in FIG. 1) is disposed such that the abutting portions 132 of the two positioning members 130*a*, 130*b* abut against the display screen 20, thereby constituting the multi-screen display apparatus 10*a* of the embodiment.

Figure 8A:
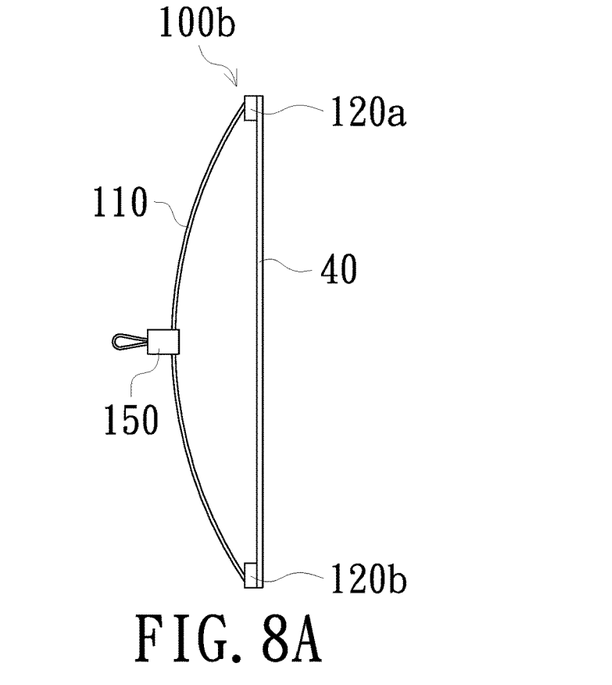
FIG. 8A and FIG. 8B are schematic diagrams of an optical element fixing mechanism and an optical element of another embodiment of the invention.
Figure 8B:
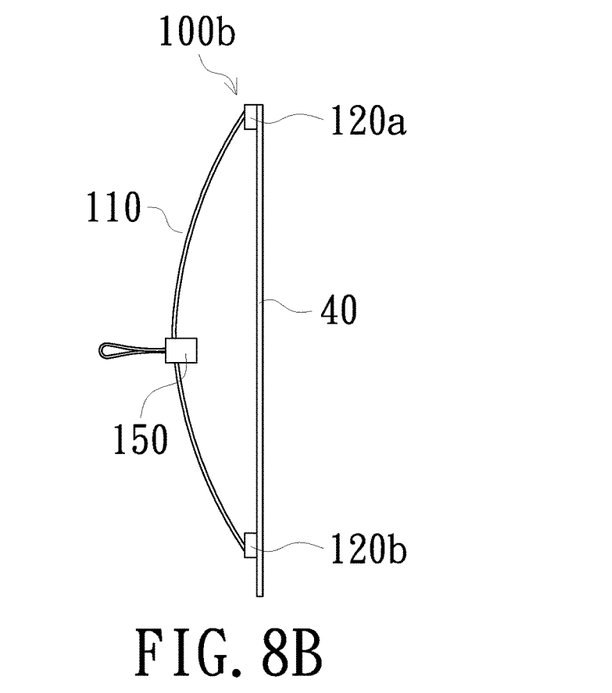

FIG. 8A and FIG. 8B are schematic diagrams of an optical element fixing mechanism and an optical element of another embodiment of the invention. Referring to FIG. 8A and FIG. 8B, the optical element fixing mechanism 100*b* of the embodiment is similar in structure and advantages to the optical element fixing mechanism 100*a*, and the only difference is that the optical element fixing mechanism 100*b* further includes an adjusting cord fastener 150. The adjusting cord fastener 150 is fastened to the fixing cord 110 and configured to adjust a length of the fixing cord 110. When configured on a display screen of a smaller size (as shown in FIG. 8B), the movable ring 120*b* can be adjusted to shorten the distance between the two rings 120*a*, 120*b*. In order to maintain the fixing tension of the fixing cord 110, the fixing length of the fixing cord 110 is shortened by the adjusting cord fastener 150, so that the optical element 40 can be firmly fixed to the display screen. The embodiment is also applicable to the optical element fixing mechanisms 100, 100*a*.

In summary, the optical element fixing mechanism of the embodiment of the invention includes a fixing cord, and the optical element can be fixed on the display screen by the fixing cord, so that the optical element can be disposed between the two display screens according to design requirements, and the optical element fixing mechanism can be applied to different types of display screens. In addition to the fixing cord, the optical element fixing mechanism of the embodiment of the invention may further include two rings and two positioning members. The two positioning members are respectively fixed to the two rings. After the two rings are sleeved on the two ends of the optical element, the two ends of the fixing cord are respectively fixed to the through holes of each of the two rings, and the fixing cord is wound around the backside of the display screen. The ring is adjusted to a position fitting the size of the display screen and fixed, so that the two clamping portions of the two positioning members jointly clamp the display screen fixed by the fixing cord, and the abutting portion of each of the two positioning members abuts against the display screen, thereby achieving the fixing function of the optical element fixing mechanism. Next, another display screen is disposed such that another abutting portion of each of the two positioning members abuts against another display screen, thereby constituting the multi-screen display apparatus of the embodiment. The optical element fixed to the display screen can guide a light beam emitted from a portion of the display area covered by the optical element to a viewer's eyes, so that when the viewer views the image formed by splicing a plurality of display screens, the frames and the optical element between the adjacent two display screens are not easily perceived, and thus the display quality can be improved.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A multi-screen display apparatus, comprising:
two display screens, arranged adjacent to each other, wherein the two display screens have an included angle, and each of the two display screens has a display area and a frame surrounding the display area;
an optical element, disposed between the two display screens and covering two adjacent sides of the frames of the two display screens and a portion of each of the display areas; and
an optical element fixing mechanism, comprising a fixing cord, wherein the fixing cord is configured to fix the optical element to one of the two display screens.

2. The multi-screen display apparatus according to claim 1, wherein the optical element has two fixing portions which are respectively located at two ends in a fixing direction parallel to the two sides, two ends of the fixing cord are respectively fixed to the two fixing portions, and the fixing cord winds around a backside of one of the two display screens.

3. The multi-screen display apparatus according to claim 2, wherein a distance between the two fixing portions is smaller than a length of each of the two sides.

4. The multi-screen display apparatus according to claim 1, wherein the optical element fixing mechanism further comprises two rings, the two rings are respectively sleeved on two ends of the optical element in a fixing direction parallel to the two sides, each of the two rings has a protrusion that protrudes toward the two display screens, the protrusion has a through hole, two ends of the fixing cord are respectively fixed to the through hole of each of the two rings, and the fixing cord winds around a backside of one of the two display screens.

5. The multi-screen display apparatus according to claim 4, wherein at least one of the two rings comprises a movable ring, and the movable ring is configured to move up and down along the fixing direction.

6. The multi-screen display apparatus according to claim 5, wherein the optical element fixing mechanism further comprises a locking screw, the movable ring further has a screw hole, and the locking screw is screwed into the screw hole and abuts against the optical element.

7. The multi-screen display apparatus according to claim 4, wherein the optical element fixing mechanism further comprises at least one adhesive bonded between at least one of the two rings and the optical element.

8. The multi-screen display apparatus according to claim 4, wherein a distance between the two through holes is smaller than a length of each of the two sides.

9. The multi-screen display apparatus according to claim 1, wherein the fixing cord comprises an elastic fixing cord.

10. The multi-screen display apparatus according to claim 9, wherein a length of the elastic fixing cord when not stretched is smaller than a length of each of the two sides.

11. The multi-screen display apparatus according to claim 1, wherein the optical element fixing mechanism further comprises an adjusting cord fastener, and the adjusting cord fastener is fastened to the fixing cord and configured to adjust a length of the fixing cord.

12. The multi-screen display apparatus according to claim 1, wherein the optical element fixing mechanism further comprises two structural reinforcement members disposed at two ends of the optical element in a fixing direction parallel to the two sides, and a hardness of the two structural reinforcement members is larger than a hardness of the optical element.

13. The multi-screen display apparatus according to claim 1, wherein the optical element fixing mechanism further comprises two positioning members disposed on a side of the optical element facing the two display screens and at two ends in a fixing direction of the optical element parallel to the two sides, each of the two positioning members has two abutting portions, and the two display screens respectively abut against the two abutting portions.

14. The multi-screen display apparatus according to claim 13, wherein each of the two positioning members has a clamping portion, the clamping portion is connected to one of the two abutting portions, and the two clamping portions of the two positioning members jointly clamp the display screen fixed by the fixing cord.

15. The multi-screen display apparatus according to claim 1, wherein the optical element fixing mechanism further comprises a label tape, and the fixing cord is disposed to pass through the label tape.

* * * * *